US011487343B2

(12) United States Patent
Sudo (10) Patent No.: US 11,487,343 B2
(45) Date of Patent: Nov. 1, 2022

(54) SEMICONDUCTOR STORING APPARATUS AND FLASH MEMORY OPERATION METHOD

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 23 days.

(21) Appl. No.: 16/882,762

(22) Filed: May 26, 2020

(65) Prior Publication Data
US 2021/0373644 A1 Dec. 2, 2021

(51) Int. Cl.
*G06F 1/3234* (2019.01)
*G11C 16/30* (2006.01)
*G11C 16/04* (2006.01)

(52) U.S. Cl.
CPC ............ *G06F 1/3275* (2013.01); *G11C 16/30* (2013.01); *G11C 16/0483* (2013.01)

(58) Field of Classification Search
CPC .... G06F 1/3275; G11C 16/30; G11C 16/0483
See application file for complete search history.

(56) References Cited

U.S. PATENT DOCUMENTS

| 7,656,737 | B2 * | 2/2010 | Liao | G11C 5/145 |
| | | | | 327/535 |
| 7,885,118 | B2 * | 2/2011 | Nam | G11C 5/145 |
| | | | | 365/185.2 |
| 10,790,007 | B1 * | 9/2020 | Lin | G11C 11/4074 |
| 10,796,773 | B1 * | 10/2020 | Piccardi | G11C 5/145 |
| 2004/0078611 | A1 * | 4/2004 | Hoehler | G06F 1/3225 |
| | | | | 713/323 |
| 2008/0148083 | A1 * | 6/2008 | Pesavento | G06F 1/3203 |
| | | | | 713/322 |

(Continued)

FOREIGN PATENT DOCUMENTS

| CN | 103809994 | 3/2017 |
| JP | 2006252748 | 9/2006 |

(Continued)

OTHER PUBLICATIONS

"Office Action of Taiwan Counterpart Application", dated Feb. 17, 2021, p. 1-p. 7.

*Primary Examiner* — Aurel Prifti
(74) *Attorney, Agent, or Firm* — JCIPRNET (57) ABSTRACT

A semiconductor storing apparatus and a flash memory operation method, for shortening a recovery time from a deep power-down (DPD) mode without a dedicated command for the DPD are provided. A flash memory includes: a standard command interface circuit and a DPD controller, operating through an external power voltage; a voltage supply node, for supplying power from the external power voltage via a first current path; a voltage supply node, for supplying power from the external power voltage via a second current path; an internal circuit group, connected to the voltage supply node; and a charge pump circuit, connected to the voltage supply node. When the DPD mode is released, the internal circuit group is enabled after the charge pump circuit is enabled.

17 Claims, 5 Drawing Sheets

(56) References Cited

U.S. PATENT DOCUMENTS

| | | | | |
|---|---|---|---|---|
| 2008/0313392 | A1* | 12/2008 | Cioaca | G06F 1/26 |
| | | | | 711/103 |
| 2009/0119527 | A1* | 5/2009 | Kim | G06F 1/3203 |
| | | | | 713/323 |
| 2009/0196102 | A1* | 8/2009 | Kim | G11C 7/1045 |
| | | | | 365/185.11 |
| 2009/0273391 | A1* | 11/2009 | Tseng | G11C 16/30 |
| | | | | 327/536 |
| 2009/0285037 | A1* | 11/2009 | Cornwell | G11C 16/30 |
| | | | | 365/189.09 |
| 2009/0316509 | A1* | 12/2009 | Sanjeevarao | G11C 7/12 |
| | | | | 365/203 |
| 2010/0142305 | A1 | 6/2010 | Lee | |
| 2010/0157674 | A1* | 6/2010 | Cornwell | G11C 16/0483 |
| | | | | 365/185.03 |
| 2011/0066869 | A1* | 3/2011 | Wakrat | G06F 1/3275 |
| | | | | 713/324 |
| 2011/0185208 | A1* | 7/2011 | Iwamoto | G06F 1/3203 |
| | | | | 713/323 |
| 2012/0102310 | A1* | 4/2012 | Shim | G11C 16/22 |
| | | | | 713/2 |
| 2012/0106251 | A1* | 5/2012 | Im | G11C 5/145 |
| | | | | 365/185.03 |
| 2014/0133240 | A1* | 5/2014 | Chen | G11C 5/148 |
| | | | | 365/185.18 |
| 2015/0071015 | A1 | 3/2015 | Kowalczyk | |
| 2018/0075897 | A1* | 3/2018 | Shimizu | G06F 11/1048 |
| 2018/0203643 | A1* | 7/2018 | Pedersen | G06F 3/0659 |
| 2019/0080728 | A1* | 3/2019 | Lee | G11C 5/148 |
| 2019/0172439 | A1* | 6/2019 | Dennis | G10K 11/17855 |
| 2019/0287574 | A1* | 9/2019 | Antonyan | G11C 7/12 |
| 2020/0201418 | A1* | 6/2020 | Richter | G06F 1/3225 |
| 2020/0303030 | A1* | 9/2020 | Lee | G11C 8/06 |
| 2020/0341652 | A1* | 10/2020 | Wu | G06F 1/3206 |
| 2021/0064257 | A1* | 3/2021 | Cariello | G06F 3/0617 |
| 2021/0096634 | A1* | 4/2021 | Fastow | G11C 16/32 |
| 2021/0125664 | A1* | 4/2021 | Hollan | G06T 19/006 |
| 2021/0157526 | A1* | 5/2021 | Kwon | G06F 3/0653 |
| 2021/0294407 | A1* | 9/2021 | Yu | G11C 5/14 |
| 2021/0311540 | A1* | 10/2021 | Wong | H02M 1/008 |
| 2021/0373645 | A1* | 12/2021 | Sudo | G06F 1/3275 |

FOREIGN PATENT DOCUMENTS

| | | | |
|---|---|---|---|
| JP | 2021140840 A | * | 9/2021 |
| TW | 201405298 | | 2/2014 |
| TW | I437434 | | 5/2014 |

* cited by examiner

SEMICONDUCTOR STORING APPARATUS AND FLASH MEMORY OPERATION METHOD

BACKGROUND

Technical Field

The disclosure relates to a semiconductor storing apparatus such as a flash memory, etc. and a method, and particularly relates to the operation of a stand-by mode or a deep power-down (DPD) mode.

Description of Related Art

A Not AND (NAND) flash memory can read or program in units of pages, and erase in units of blocks. The flash memory shown in Patent Document 1 (Japanese Patent Laid-Open No. 2006-252748) discloses the following technology. In a stand-by mode and a normal operation mode, different power voltages are supplied to a page buffer/readout circuit, thereby reducing power consumption in the stand-by mode.

SUMMARY

The disclosure provides a flash memory having an active mode and a stand-by mode. The active mode reads, programs, erases, etc. in response to a command from the user. The stand-by mode may handle the command from the user. In the stand-by mode, the operation of an internal circuit is restricted so that power consumption is below a certain level. However, in the case where the user inputs a command, the command must be immediately responded to. Therefore, even in the stand-by mode, off-leak current is generated in a volatile circuit such as a logic circuit, a register, etc. Off-leak current increases with the reduction in size of the element. In addition, in the case where an internal power voltage is used, an internal power voltage detection circuit must be operated, which consumes a certain amount of power. That is, it is difficult to reduce current consumption in the stand-by mode.

In order to further reduce power consumption in the stand-by mode, a deep power-down mode (hereinafter referred to as a DPD mode) is installed depending on the flash memory. In the DPD mode, the internal power supply to a portion of the active internal circuit used in the stand-by mode is turned off to reduce off-leakage current. For example, the flash memory enters the DPD mode through a DPD start command and recovers from the DPD mode through a DPD release command. Regarding the recovery from the DPD mode, a certain time is required for the shutdown circuit to operate normally, but on the other hand, power consumption can be significantly reduced.

Figure 1A:
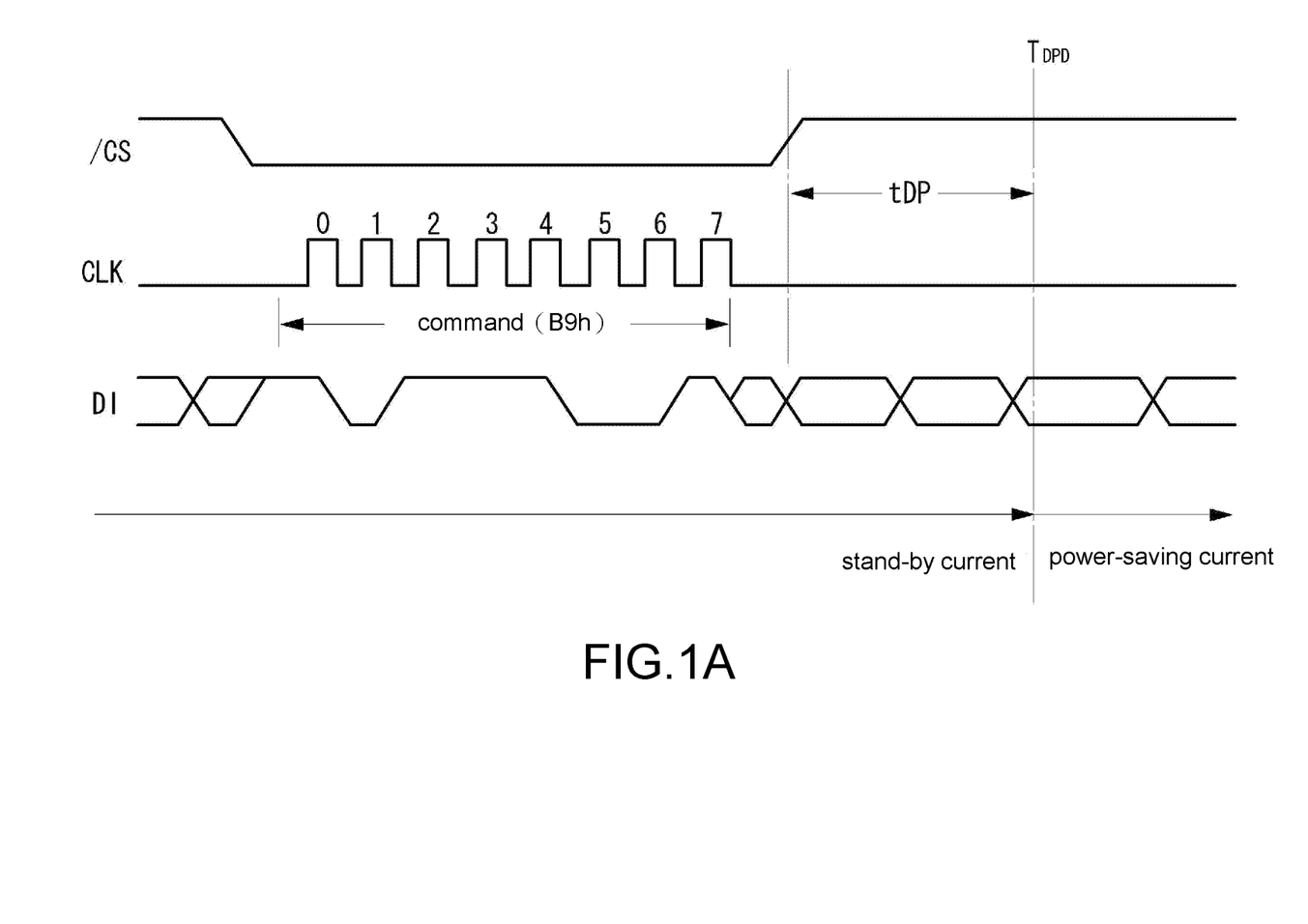
FIG. 1A is a diagram showing an example of an operation waveform when a conventional flash memory transitions to a deep power-down mode (DPD) mode.

FIG. 1A shows an example of an operation waveform when a NAND flash memory installed with a serial peripheral interface (SPI) function transitions to the DPD mode. In the stand-by mode, the flash memory is selected through setting a chip selection signal/CS to a low level. During the period, a DPD command (B9h) is inputted from a data registration terminal DI in synchronization with a clock signal. The flash memory transitions to the DPD mode at a time $T_{DPD}$ after a certain period tDP since the input of the DPD command, and blocks an internal voltage supply to a specific internal circuit. During a period before the time $T_{DPD}$, current in the stand-by mode is consumed. During a period after the time $T_{DPD}$, current in the DPD mode is consumed.

Figure 1B:
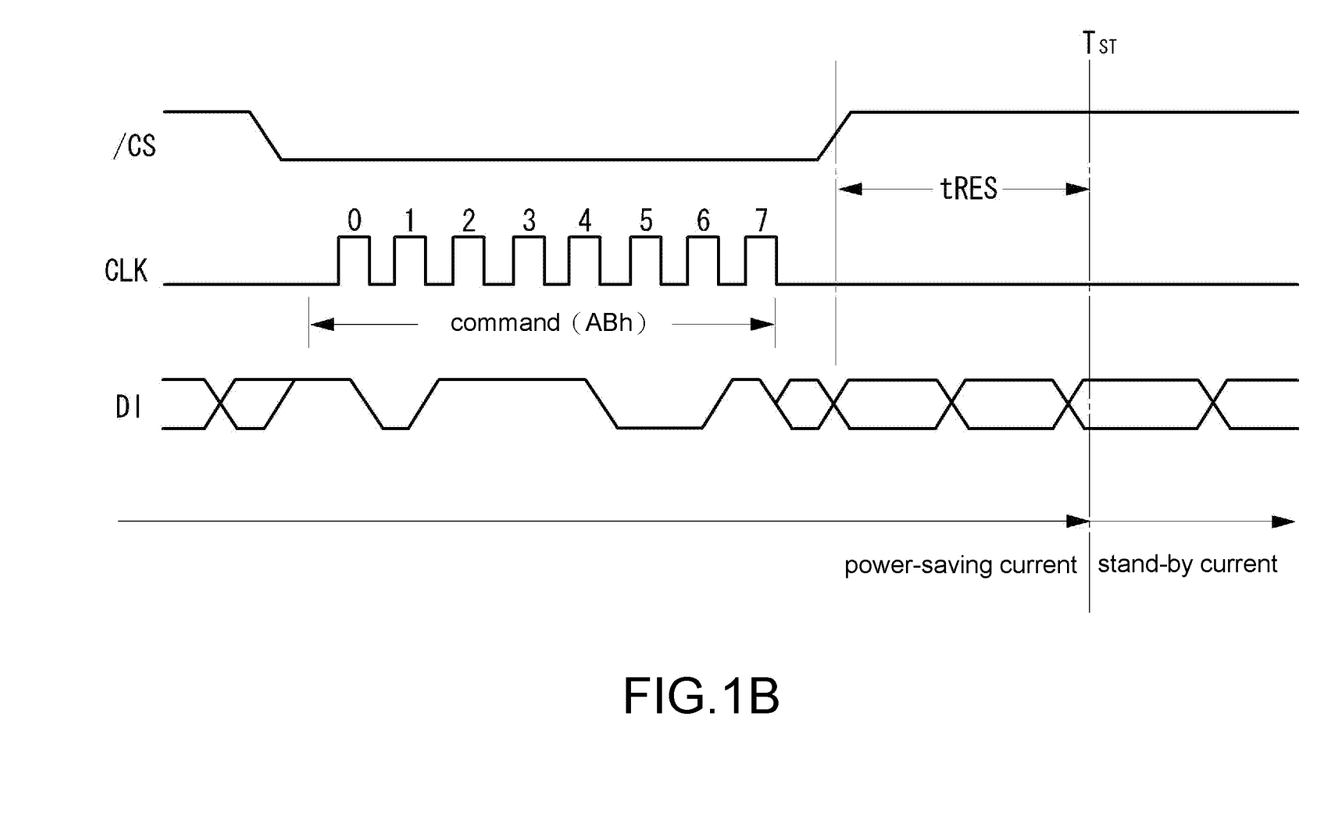
FIG. 1B is a diagram showing an example of an operation waveform when the conventional flash memory is released from the DPD mode.

In addition, FIG. 1B shows an example of an operation waveform when recovering from the DPD mode. In the stand-by mode, the flash memory is selected through setting the chip selection signal/CS to a low level. During the period, a DPD release command (ABh) for releasing the DPD mode is inputted from the data registration terminal DI in synchronization with a clock signal. The flash memory starts supplying power to the shutdown internal circuit during a period tRES since the input of the DPD release command, and recovers to the state where the internal circuit is in a normal operation at a time $T_{ST}$. Before the time $T_{ST}$, current in the DPD mode is consumed. After the time $T_{ST}$, current in the stand-by mode is consumed.

Figure 2:
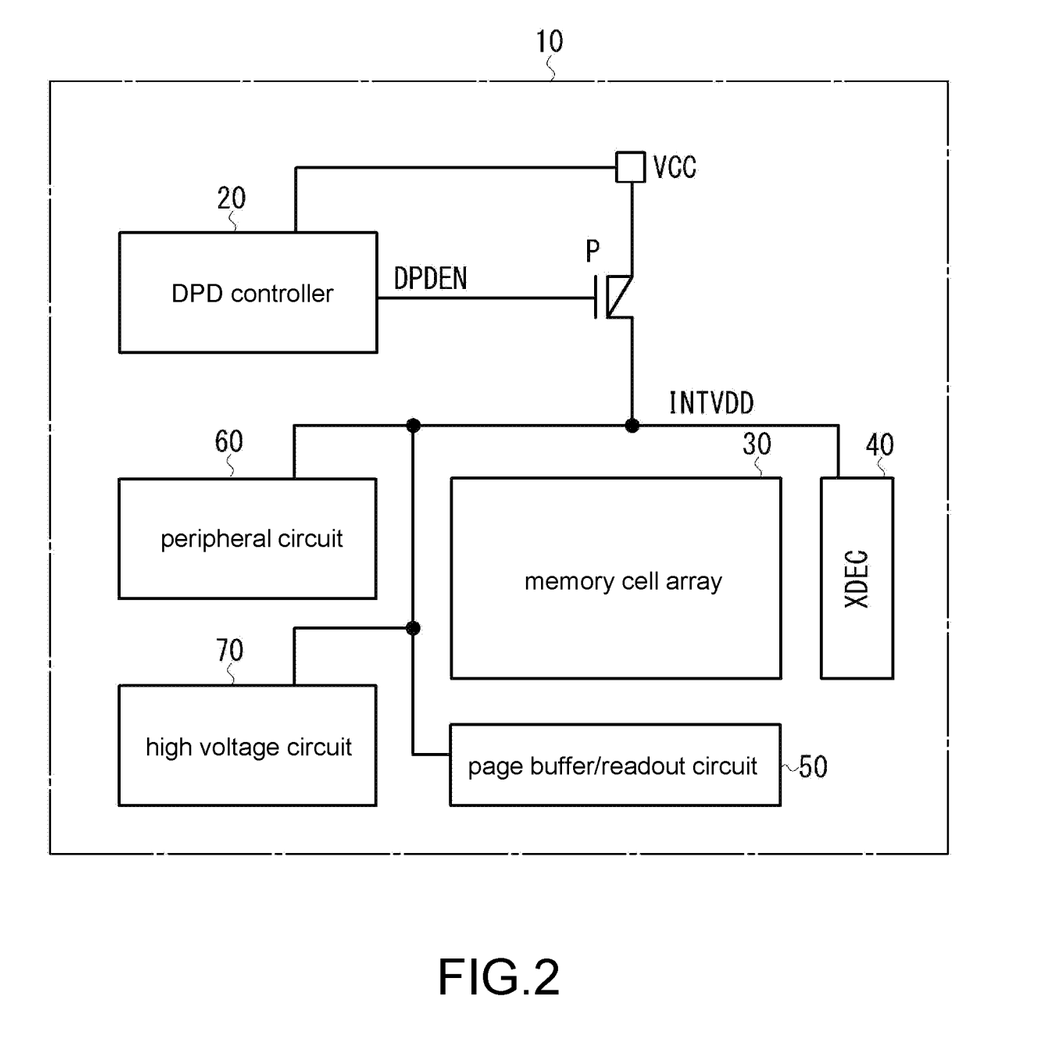
FIG. 2 is a diagram showing an internal structure of the conventional flash memory.

FIG. 2 is an internal block diagram of a NAND flash memory supporting the DPD mode. A flash memory 10 includes a DPD controller 20, a memory cell array 30, a row decoder 40, a page buffer/readout circuit 50, a peripheral circuit 60, a high voltage circuit 70, etc. An external power voltage VCC (for example, 3.3V) is supplied to the flash memory 10. The DPD controller 20 directly operates using the external power voltage VCC. A positive channel metal oxide semiconductor (PMOS) transistor P is connected between the external power voltage VCC and the internal circuit. A DPD enable signal DPDEN is applied to the gate of the transistor P. In the active mode and the stand-by mode, the DPD controller 20 generates the L-level DPD enable signal DPDEN to turn on the transistor P. As a result, an internal voltage VDD is supplied to each internal circuit via a voltage supply node INTVDD. In the DPD mode, the DPD controller 20 generates the H-level DPD enable signal DPDEN and sets the transistor P as not turned on. As a result, the supply of the external power voltage VCC is shut down and the operation of the internal circuit is stopped.

In the case where the DPD mode is released, as shown in FIG. 1B, the user inputs the DPD release command (ABh) from the outside. The DPD controller 20 responds to the input of the DPD release command, transitions the DPD enable signal DPDEN to L-level, turns on the transistor P, and starts supplying power from the external power voltage VCC to the internal circuit. As a result, the internal circuit is recovered to an enabled state after the period tRES.

In this way, for a conventional flash memory, in order to use the DPD mode, the user must not only input a DPD command, but also input a DPD release command. Flash memory controllers that do not support the DPD command and the DPD release command are unable to use the DPD mode. Furthermore, when the DPD mode is released and power from the external supply voltage VCC is supplied to the voltage supply node INTVDD, if the load capacitance of the internal circuit is large, the period tRES until the voltage supply node INTVDD reaches the enabling voltage of the internal circuit becomes longer.

The objective of the disclosure is to provide a semiconductor storing apparatus that can shorten the recovery time for recovering from the DPD mode without using a dedicated command for releasing the DPD mode.

The flash memory operation method of the disclosure includes the following steps. A step of transitioning to a DPD mode blocking power supply from a power supply source to an internal circuit. A step of releasing the DPD mode when a standard command including reading, programming, or erasing is inputted. A step of executing the standard command after the DPD mode is released. The step of releasing supplies power from the power supply source to at least a first circuit portion and a second circuit portion of the internal circuit, respectively.

In an embodiment of the flash memory according to the disclosure, the step of releasing further supplies a first enable signal for enabling the first circuit portion to the first circuit portion, and supplies a second enable signal for enabling the second circuit portion to the second circuit portion after supplying the first enable signal. In an embodiment of the flash memory according to the disclosure, the step of executing uses the first circuit portion in a first processing sequence, and uses the second circuit portion in a second processing sequence after the first processing sequence. In an embodiment of the flash memory according to the disclosure, a first recovery time until the first enable signal is supplied and a second recovery time until the second enable signal is supplied are even shorter than a recovery time for enabling the entire internal circuit. In an embodiment of the flash memory according to the disclosure, the load capacitance of the first circuit portion is smaller than the load capacitance of the second circuit portion. In an embodiment of the flash memory according to the disclosure, the first circuit portion includes a charge pump circuit, the second circuit portion includes a peripheral circuit of a memory cell array, and time required for the charge pump circuit to generate a boosted voltage is even shorter than a difference between the second recovery time and the first recovery time. In an embodiment of the flash memory according to the disclosure, the DPD mode transitions from a stand-by mode when the stand-by mode continues for a certain period of time.

The semiconductor storing apparatus of the disclosure includes: an internal circuit, including at least a first circuit portion and a second circuit portion; a transition component, for transitioning to a DPD mode blocking power supply from a power supply source to the first circuit portion and the second circuit portion; a release component, for releasing the DPD mode when a standard command including reading, programing, or erasing is inputted; and an execution component, for executing the standard command after releasing the DPD mode. The release component includes: a first current path, for supplying power from the power supply source to the first circuit portion; and a second current path, for supplying power from the power supply source to the second circuit portion.

In an embodiment of the semiconductor storing apparatus according to the disclosure, the release component includes: a first supply component, for supplying a first enable signal for enabling the first circuit portion to the first circuit portion; and a second supply component, for supplying a second enable signal for enabling the second circuit portion to the second circuit portion after supplying the first enable signal. In an embodiment of the semiconductor storing apparatus according to the disclosure, the execution component uses the first circuit portion in a first processing sequence and uses the second circuit portion in a second processing sequence after the first processing sequence. In an embodiment of the semiconductor storing apparatus according to the disclosure, a first recovery time until the first enable signal is supplied and a second recovery time until the second enable signal is supplied are even shorter than a recovery time for enabling the first circuit portion and the second circuit portion. In an embodiment of the semiconductor storing apparatus according to the disclosure, the load capacitance of the first circuit portion is smaller than the load capacitance of the second circuit portion. In an embodiment of the semiconductor storing apparatus according to the disclosure, the first circuit portion includes a charge pump circuit, the second circuit portion includes a peripheral circuit of a memory cell array, and time required for the charge pump circuit to generate a boosted voltage is even shorter than a difference between the second recovery time and the first recovery time. In an embodiment of the semiconductor storing apparatus according to the disclosure, the release component includes a first transistor and a second transistor at the first current path and the second current path, and the release component controls the first transistor and the second transistor to be turned on or off. In an embodiment of the semiconductor storing apparatus according to the disclosure, the semiconductor storing apparatus is a flash memory.

According to the disclosure, the DPD mode can be released in response to the inputted standard command without a dedicated command for releasing the DPD mode. Furthermore, when the DPD mode is released, power is supplied from the power supply source to the first circuit portion and the second circuit portion, respectively. Therefore, compared with the case where the first circuit portion and the second circuit portion are commonly supplied with power, time for enabling the first circuit portion and the second circuit portion can be shortened. As a result, the recovery time from the DPD mode can be minimized.

To make the aforementioned and other features of the disclosure more comprehensible, several embodiments accompanied with drawings are described in detail as follows.

DETAILED DESCRIPTION OF DISCLOSED EMBODIMENTS

The semiconductor storing apparatus of the disclosure is not particularly limited, and is implemented as, for example, a Not AND (NAND) or a Not OR (NOR) flash memory.

Figure 3:
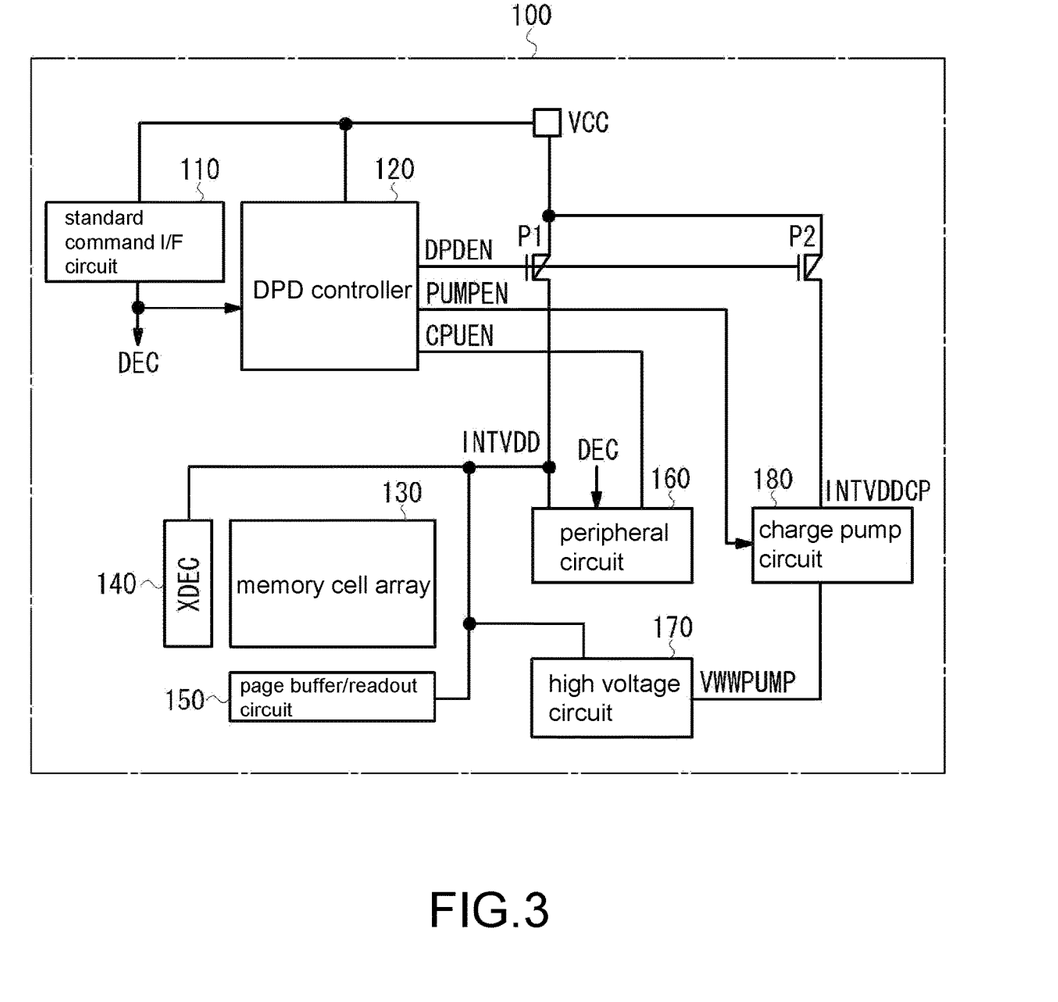
FIG. 3 is a diagram showing an internal structure of a flash memory according to an embodiment of the disclosure.

Next, the embodiments of the disclosure will be described in detail with reference to the drawings. FIG. 3 is a diagram showing a schematic internal structure of a NAND flash memory according to an embodiment of the disclosure. A flash memory 100 includes: a standard command interface (I/F) circuit 110 for receiving a standard command, a deep power-down mode (DPD) controller 120 for controlling the transition to a DPD mode, the release of the DPD mode, etc., a memory cell array 130, a row decoder 140, a page buffer/readout circuit 150, and internal circuits such as a peripheral circuit 160, a high voltage circuit 170, a charge pump circuit 180, etc.

The flash memory 100 of the embodiment can operate in a plurality of power consumption modes. An active mode does not limit power consumption and executes standard commands (such as reading, programming, erasing), etc. in full specifications. A stand-by mode operates the internal circuit according to the requirement of the specified power consumption while executing the operation in response to the inputted standard command, etc. when not in the active mode. In the stand-by mode, for example, the charge pump of the high voltage circuit is stopped or the internal supply voltage is reduced. In order to further reduce power consumption in the stand-by mode, the DPD mode blocks power supply to a specific circuit in the stand-by mode.

The standard command I/F circuit 110 and the DPD controller 120 directly operate using an external power voltage VCC (for example, 3.3V), that is, the standard command I/F circuit 110 and the DPD controller 120 may operate in the stand-by mode and the DPD mode. The standard command I/F circuit 110 is an interface circuit for externally accepting a standard command prepared in advance for a standard operation of a flash memory. The standard commands are, for example, commands for reading, programming, erasing, etc. The standard command I/F circuit 110 includes a complementary metal oxide semiconductor (CMOS) logic device for decoding the inputted standard command, and a decode result DEC is provided to the DPD controller 120 and the peripheral circuit 160 (including a controller, a state machine, etc. for controlling the operation of the standard command).

The DPD controller 120 controls the transition from the stand-by mode to the DPD mode and the release of the DPD mode. A positive channel metal oxide semiconductor (PMOS) transistor P1 is connected to a first current path between the external power voltage VCC and a voltage supply node INTVDD, and a PMOS transistor P2 is connected to a second current path between the external power voltage VCC and a voltage supply node INTVDDCP. At the voltage supply node INTVDD, the row decoder 140, the page buffer/readout circuit 150, the peripheral circuit 160, and the high voltage circuit 170 are connected, and at the voltage supply node INTVDDCP, the charge pump circuit 180 is connected.

The DPD enable signal DPDEN from the DPD controller 120 is commonly applied to the gates of the transistor P1 and the transistor P2. The DPD controller 120 generates the L-level DPD enable signal DPDEN in the active mode and the stand-by mode to turn on the transistor P1 and the transistor P2, and supplies power from the external power voltage VCC to the voltage supply node INTVDD via the first current path and to the voltage supply node INTVDDCP via the second current path. In addition, the DPD controller 120 in the DPD mode transitions the DPD enable signal DPDEN to H-level, sets the transistor P1 and the transistor P2 of the first current path and the second current path as not turned on, and blocks voltage supply from the external power voltage VCC to the voltage supply node INTVDD and the voltage supply node INTVDDCP.

The method for transitioning from the stand-by mode to the DPD mode is not particularly limited. In a certain form, the DPD controller 120 does not input a command for transitioning to the DPD mode from the user, but automatically transitions to the DPD mode in response to a signal from the peripheral circuit 160 (including a controller, etc. for controlling the operation of the flash memory). For example, if a signal indicating the transition to the stand-by mode is provided from the peripheral circuit 160 to the DPD controller 120, the DPD controller 120 measures time from the time point indicating the transition to the stand-by mode, transitions to the DPD mode when the duration of the stand-by mode exceeds a certain time to transition the DPD enable signal DPDEN to H-level, and blocks power supply from the external power voltage VCC. In addition, in another form, the DPD controller 120 may also transition to the DPD mode in response to the inputted command for transitioning to the DPD mode from the user.

Regarding the method for releasing the DPD mode, in a conventional flash memory, it is necessary to input a dedicated command for releasing the DPD mode from the outside. However, in the embodiment, the DPD mode is automatically released without inputting such a dedicated command. If the standard command I/F circuit 110 inputs the standard command in the DPD mode, the DPD controller 120 releases the DPD mode in response to the inputted standard command. The inputted standard command is seamlessly executed after the time required for recovering from the DPD mode has elapsed.

When the DPD controller 120 is still in the DPD mode, that is, when power is supplied from the external supply voltage VCC to the voltage supply node INTVDD and the voltage supply node INTVDDCP via the first current path and the second current path, respectively, a pump enable signal PUMPEN for making the charge pump circuit 180 and a central processing unit (CPU) enable signal CPUEN for enabling a CPU included in a controller of the peripheral circuit 160 subsequently are respectively generated. The pump enable signal PUMPEN is supplied to the charge pump circuit 180, and the CPU enable signal CPUEN is supplied to the peripheral circuit 160. The details of the operations will be described later. From the time point the DPD mode is released when the voltage supply node INTVDDCP reaches a target voltage, the DPD controller 120 transitions the pump enable signal PUMPEN to H-level, so that the charge pump circuit 180 is enabled. Then, when the voltage supply node INTVDD reaches the target voltage, the DPD controller 120 transitions the CPU enable signal CPUEN to H-level, so that the controller of the peripheral circuit 160 is enabled.

The DPD controller 120 of the embodiment may be constructed using a hardware and/or a software, which may, for example, include a microcomputer, a state machine, a logic device, etc.

The memory cell array 130 contains a plurality of blocks, and each block contains a plurality of NAND strings. The NAND strings may be two-dimensionally formed on a substrate or three-dimensionally formed along a vertical direction from the main surface of the substrate. In addition, a memory unit may store binary data or multi-value data.

The peripheral circuit 160 includes, for example, the following parts, etc.: a controller or a state machine, for controlling the operation of the flash memory 100 based on the standard command, etc. received by the standard command I/F circuit 110; or an error checking and correction (ECC) circuit and a column selection circuit, for detecting error and correcting data. The high voltage circuit 170 receives the voltage boosted by the charge pump circuit 180 and generates high voltage required for reading, programming, and erasing operations (for example, programming pulse voltage, erasing pulse voltage, reading path voltage, etc.). In addition, the flash memory 100 may be installed with a serial peripheral interface (SPI). In the SPI, the control signal (allowing address latching, command latching, etc.) is replaced, and inputted command, address, and data are synchronously identified with a serial clock signal.

Figure 4:
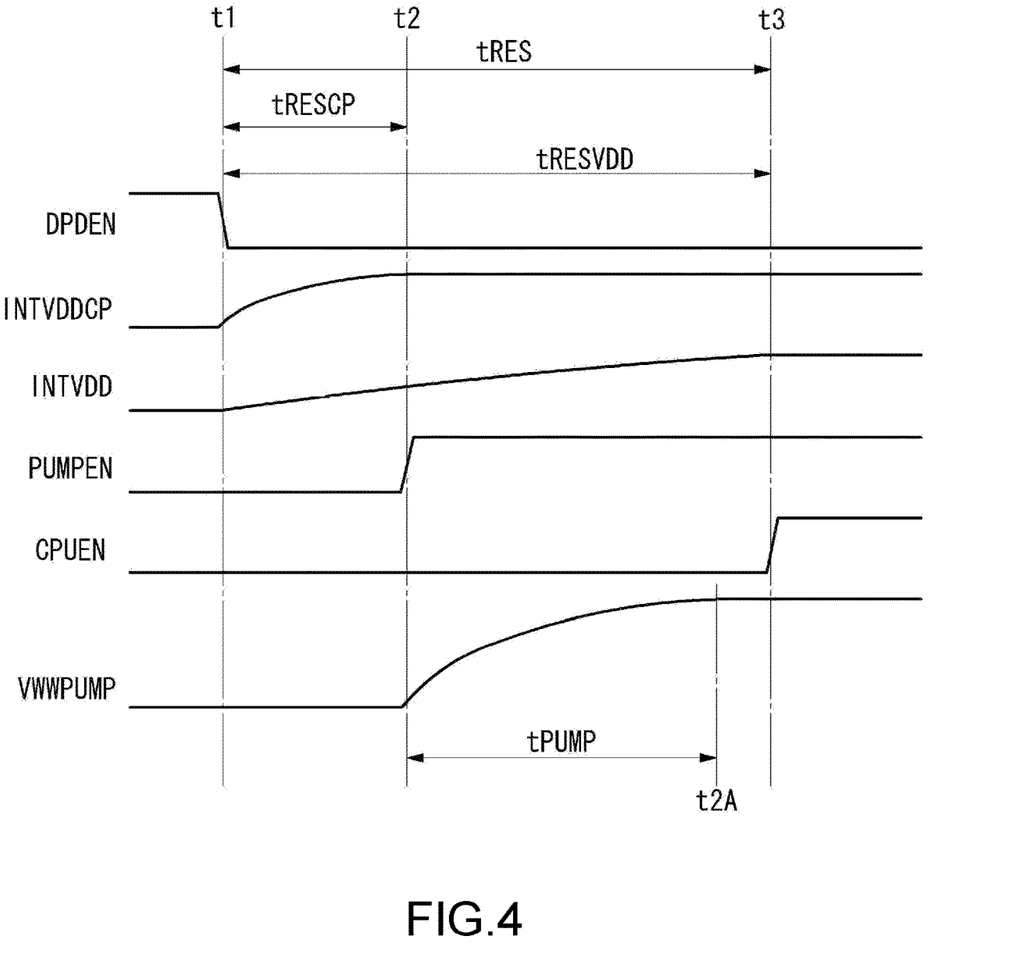
FIG. 4 is a diagram showing an operation waveform of each portion when a DPD mode according to the embodiment of the disclosure is released.

Next, the release operation of the DPD mode of the flash memory according to the embodiment is described. FIG. 4 is a diagram showing an operation waveform of each portion when the DPD mode is released. When the flash memory 100 is in the DPD mode, the DPD enable signal DPDEN is at H-level, power supply from the external supply voltage VCC is blocked, and the voltage supply node INTVDD and the voltage supply node INTVDDCP are at ground (GND) level. In the DPD mode, the standard command I/F circuit 110 and the DPD controller 120 are enabled through power from the external supply voltage VCC.

If the standard command is inputted to the standard command I/F circuit 110, the standard command I/F circuit 110 provides the decode result DEC of the standard command to the DPD controller 120 and the peripheral circuit 160. However, at this time point, the peripheral circuit 160 is not enabled.

If the DPD controller 120 receives the decode result DEC from the standard command I/F command 110 in the DPD mode, the DPD mode is automatically released. That is, the DPD controller 120 transitions the DPD enable signal DPDEN from H-level to L-level at a time t1, and sets the transistor P1 and the transistor P2 as turned on. Thus, for the voltage supply node INTVDD, power is supplied from the external supply voltage VCC via the first current path, and for the voltage supply node INTVDDCP, power is supplied from the external supply voltage VCC via the second current path. That is, the voltage supply node INTVDD and the voltage supply node INTVDCP are respectively charged by power from the external supply voltage VCC.

At the voltage supply node INTVDD, the row decoder 140, the page buffer/readout circuit 150, the peripheral circuit 160, and the high voltage circuit 170 are connected, and at the voltage supply node INTVDDCP, the charge pump circuit 180 is connected. Compared with the charge pump circuit 180 connected to the voltage supply node INTVDDCP, peripheral circuit group 140 to 170 connected to the voltage supply node INTVDD has a larger number and wiring capacitance (larger load capacitance) of transistors, so the speed of the voltage supply node INTVDD increasing to the target voltage is slower than that of the voltage supply node INTVDDCP. Therefore, the charging time of the voltage supply node INTVDDCP reaching the target voltage is faster than that of the voltage supply node INTVDD. As shown in FIG. 4, the voltage supply node INTVDDCP reaches the target voltage at a time t2 after a period tRESCP from the time t1, but the voltage supply node INTVDD reaches the target voltage is at a time t3 after a period tRESVDD from the time t1 (tRESCP<tRESVDD). In addition, the target voltage of the voltage supply node INTVDDCP is the voltage at which the charge pump circuit 180 is enabled, and the target voltage of the voltage supply node INTVDD is the voltage at which the CPU of the peripheral circuit 160 is enabled.

The DPD controller 120 transitions the pump enable signal PUMPEN from L-level to H-level at the time t2 when the charge pump circuit 180 is enabled. The charge pump circuit 180 starts the pump operation at the time t2 in response to the pump enable signal PUMPEN, and generates a desired pump voltage VWWPUMP at a time t2A after a period tPUMP from the time t2. In the embodiment, the charge pump circuit 180 may operate after the voltage supply node INTVDDCP reaches the target voltage without waiting for the voltage supply node INTVDD to reach the target voltage.

In addition, the DPD controller 120 transitions the CPU enable signal CPUEN from L-level to H-level at the time t3 when the peripheral circuit 160 is enabled. The controller (CPU) of the peripheral circuit 160 starts the operation of the standard command at the time t3 in response to the CPU enable signal CPUEN. At the time t3 when the two voltage supply nodes INTVDD and INTVDDCP reach the target voltage, the period tRES of recovery time from the DPD mode ends. If the relationship is tPUMP<tRESVDD−tRESCP, the pump voltage VWWPUMP is already generated at the time point when the operation of the standard command is started, so the high voltage generation circuit 170 may immediately supply high voltage required for operation to the page buffer/readout circuit 150, the row decoder 140, etc. Conversely, even if the relationship is tPUMP>tRESVDD−tRESCP, compared with the case where the operation of the charge pump circuit 180 is not advanced, the pump voltage VWWPUMP may still be supplied more quickly.

The control method of the DPD controller using the time t2 and the time t3 120 is not particularly limited. For example, the DPD controller 120 may also use a built-in timer to measure time from the time t1, transition the enable signal PUMPEN and the enable signal CPUEN to H-level when the periods tRESCP and tRESVDD are reached. In addition, in another form, a detection circuit for detecting voltage of the voltage supply node INTVDDCP and the voltage supply node INTVDD may also be provided. When the detection circuit detects the target voltage of each voltage supply node, the DPD controller 120 transitions the enable signal PUMPEN and the enable signal CPUEN to H-level.

As a specific operation example, if a read, program, or erase command is inputted to the standard command I/F circuit 110 in the DPD mode, the DPD controller 120 transitions the DPD enable signal DPDEN to L-level, so that the transistor P1 and the transistor P2 are turned on, power is supplied from the external supply voltage VCC, and the DPD mode is released. The DPD controller 120 operates the charge pump circuit 180 at the time t2 after the period tRESCP from time t1 during the period until voltage of the voltage supply node INTVDD and the voltage supply node INTVDDCP is recovered, and during the period from the time t1 to the time t3 after the period tRESVDD, the pump voltage VWWPUMP is generated through the charge pump circuit 180, and the controller of the peripheral circuit 160 starts executing a command at the time t3. The boost voltage required for reading, programming, or erasing may be immediately used after executing the command.

In this way, according to the embodiment, the DPD mode may be released with an appropriate recovery time according to the operation content of the standard command, and the standard command may be executed.

Furthermore, when the shutdown internal circuit is recovered from the DPD mode, power is not supplied to the voltage supply node INTVDD connected to the entire internal circuit as shown in FIG. 2 in the past. Instead, power is dividedly supplied to the voltage supply node INTVDD connected to the peripheral circuit group 140 to 170 and the voltage supply node INTVDDCP connected to the charge pump circuit 180 power, respectively, to advance the operation of the charge pump circuit 180. Therefore, compared with the past, the time tRES for recovering the internal circuit to an enabled state can be shortened (FIG. 1B).

In addition, in the embodiments, an example in which the internal circuit with power supply blocked by the DPD mode is divided into the peripheral circuit group 140 to 170 and the charge pump circuit 180 to recover from the DPD mode is shown, but the disclosure is not necessarily limited to such form of division. When recovering from the DPD mode, the internal circuit for advancing the operation does not necessarily include the charge pump circuit, which may be other circuits. Furthermore, the circuit recovered from the internal circuit may be divided into three or more circuit portions, and power may be supplied to each circuit portion via different current paths.

In a certain form, in the case where the first circuit portion and the second circuit portion are recovered from the DPD mode, the selection of the first circuit portion and the second circuit portion may also correspond to the processing sequence when executing the standard command. That is, when executing the standard command, the first processing sequence uses the first circuit portion and the second processing sequence uses the second circuit portion, the first circuit portion is enabled first compared with the second circuit portion. When the load capacitance of the first circuit portion is smaller than the load capacitance of the second circuit portion, the first circuit portion starts to operate during the recovery of the second circuit portion, and the recovery time is shortened more effectively. For example, in the case where the programming operation includes two operations, programming verification and programming, and the programming verification is operated first, only the circuit portion related to verification and connected to a voltage supply node INTVDDx is operated first, in the verification operation, a voltage supply node INTVDDy connected to the circuit portion for programming reaches the target voltage.

In addition, in the embodiments, reading, programming, and erasing are exemplified as standard commands. However, in addition to the same, standard commands may also include a status read, an identifier (ID) read, etc. The status read is to read whether the flash memory is in a ready state, whether the flash memory is in a write protection mode, whether a command is during a programming/erasing operation, and the ID read is to read a command for identifying a manufacturer or a product.

In addition, in the embodiments, an example in which power is supplied from the external supply voltage VCC to the voltage supply node INTVDD and the voltage supply node INTVDDCP is shown, which is only one example. Power may also be supplied to the voltage supply node INTVDD and the voltage supply node INTVDDCP from other internal power voltages without directly supplying from the external supply voltage VCC.

The embodiments of the disclosure are described in details above, but the disclosure is not limited to the specific embodiments, and various modifications and changes may be made within the scope of the disclosure as recited in the claims.

What is claimed is:

1. A flash memory operation method, comprising:
    a step of transitioning to a deep power-down mode, blocking power supply from a power supply source to an internal circuit by a deep power-down mode (DPD) controller;
    a step of releasing the deep power-down mode when a standard command comprising reading, programming, or erasing is inputted; and
    a step of executing the standard command after releasing the deep power-down mode, wherein
    the step of releasing the deep power-down mode supplies power from the power supply source to at least a first circuit portion and a second circuit portion of the internal circuit, respectively, wherein the DPD controller is different from the power supply source,
    wherein the step of releasing the deep power-down mode also supplies a first enable signal for enabling the first circuit portion to the first circuit portion and supplies a second enable signal for enabling the second circuit portion to the second circuit portion after the first enable signal is supplied,
    wherein the step of executing the standard command uses the first circuit portion during a period and uses the second circuit portion after the period, wherein the first circuit portion comprises a charge pump circuit, and the second circuit portion comprises a peripheral circuit of a memory cell array.

2. The flash memory operation method according to claim 1, wherein
    a first recovery time until the first enable signal is supplied and a second recovery time until the second enable signal is supplied are shorter than a recovery time for enabling the entire internal circuit.

3. The flash memory operation method according to claim 2, wherein
    time required for the charge pump circuit to generate a boosted voltage is shorter than a difference between the second recovery time and the first recovery time.

4. The flash memory operation method according to claim 1, wherein
    a load capacitance of the first circuit portion is smaller than a load capacitance of the second circuit portion.

5. The flash memory operation method according to claim 1, wherein
    the deep power-down mode transitions from a stand-by mode when the stand-by mode continues for a certain period of time.

6. A semiconductor storing apparatus, comprising:
    an internal circuit, containing at least a first circuit portion and a second circuit portion;
    a transition component, for transitioning to a deep power-down mode blocking power supply from a power supply source to the first circuit portion and the second circuit portion by a deep power-down mode (DPD) controller, wherein the DPD controller is different from the power supply source;
    a release component, for releasing the deep power-down mode when a standard command comprising reading, programming, or erasing is inputted; and
    an execution component, for executing the standard command after releasing the deep power-down mode, wherein
    the release component comprises: a first current path, for supplying power from the power supply source to the first circuit portion; and a second current path, for supplying power from the power supply source to the second circuit portion,
    wherein the execution component uses the first circuit portion during a period and uses the second circuit portion after the period, wherein the first circuit portion comprises a charge pump circuit, and the second circuit portion comprises a peripheral circuit of a memory cell array.

7. The semiconductor storing apparatus according to claim 6, wherein
    the release component comprises: a first supply component, for supplying a first enable signal for enabling the first circuit portion to the first circuit portion; and a second supply component, for supplying a second enable signal for enabling the second circuit portion to the second circuit portion after supplying the first enable signal.

8. The semiconductor storing apparatus according to claim 7, wherein a first recovery time until the first enable signal is supplied and a second recovery time until the second enable signal is supplied are shorter than a recovery time for enabling the first circuit portion and the second circuit portion.

9. The semiconductor storing apparatus according to claim 7, wherein
a load capacitance of the first circuit portion is smaller than a load capacitance of the second circuit portion.

10. The semiconductor storing apparatus according to claim 7, wherein
the semiconductor storing apparatus is a flash memory.

11. The semiconductor storing apparatus according to claim 6, wherein
a first recovery time until the first enable signal is supplied and a second recovery time until the second enable signal is supplied are shorter than a recovery time for enabling the first circuit portion and the second circuit portion.

12. The semiconductor storing apparatus according to claim 11, wherein
time required for the charge pump circuit to generate a boosted voltage is shorter than a difference between the second recovery time and the first recovery time.

13. The semiconductor storing apparatus according to claim 6, wherein
a load capacitance of the first circuit portion is smaller than a load capacitance of the second circuit portion.

14. The semiconductor storing apparatus according to claim 6, wherein
a load capacitance of the first circuit portion is smaller than a load capacitance of the second circuit portion.

15. The semiconductor storing apparatus according to claim 6, wherein,
the release component comprises a first transistor and a second transistor at a first current path and a second current path, and the first transistor and the second transistor are controlled to be turned on or off by the DPD controller.

16. The semiconductor storing apparatus according to claim 6, wherein
the semiconductor storing apparatus is a flash memory.

17. The semiconductor storing apparatus according to claim 6, wherein
the semiconductor storing apparatus is a flash memory.

\* \* \* \* \*